United States Patent
Steenhof et al.

(10) Patent No.: US 9,019,009 B2
(45) Date of Patent: Apr. 28, 2015

(54) POP-NOISE REDUCTION

(71) Applicant: NXP B.V., Eindhoven (NL)

(72) Inventors: Frits Anthonie Steenhof, Waalre (NL); Mattheus Johan Koerts, Arnhem (NL); Skule Pramm, Nijmegen (NL)

(73) Assignee: NXP, B.V., Eindhoven (NL)

( * ) Notice: Subject to any disclaimer, the term of this patent is extended or adjusted under 35 U.S.C. 154(b) by 139 days.

(21) Appl. No.: 13/860,714

(22) Filed: Apr. 11, 2013

(65) Prior Publication Data

US 2013/0285745 A1 Oct. 31, 2013

(30) Foreign Application Priority Data

Apr. 27, 2012 (EP) .................... 12165980

(51) Int. Cl.
*H03F 3/38* (2006.01)
*H03F 3/217* (2006.01)
*H03F 1/26* (2006.01)

(52) U.S. Cl.
CPC ............ *H03F 3/2171* (2013.01); *H03F 1/26* (2013.01); *H03F 3/217* (2013.01)

(58) Field of Classification Search
CPC ................................. H03G 3/38; H03G 3/217
USPC .......................... 330/10, 207 A, 251
See application file for complete search history.

(56) References Cited

U.S. PATENT DOCUMENTS 6,768,376 B2 7/2004 Hoyt et al.
2006/0262843 A1* 11/2006 Kim et al. .................. 375/238

FOREIGN PATENT DOCUMENTS

FR 2 955 723 A1 7/2011

OTHER PUBLICATIONS

Extended European Search Report for European Patent Appln. No. 12165980.9 (Aug. 31, 2012).

* cited by examiner

*Primary Examiner* — Steven J Mottola

(57) ABSTRACT

A method of adjusting the frequency or phase of operation of a Class-D amplifier is disclosed. The method comprises making a series of step changes in the frequency or phase to adjust the frequency or phase from a start value to a desired end value, each step change in frequency or phase causing a corresponding disturbance of an output of the Class-D amplifier to produce a series of disturbances, each of which varies from an initial magnitude in first and second senses to exhibit a first peak and then in the first sense to exhibit a second peak. The time between the step changes is selected so that the second peak of each disturbance other than a final disturbance in the series overlaps the first peak of an immediately succeeding disturbance.

15 Claims, 3 Drawing Sheets

POP-NOISE REDUCTION

CROSS-REFERENCE TO RELATED APPLICATIONS

This application claims the priority under 35 U.S.C. §119 of European patent application no. 12165980.9, filed on Apr. 27, 2012, the contents of which are incorporated by reference herein.

The invention relates to methods of adjusting the frequency or phase of operation of a Class-D amplifier so as to reduce pop-noise caused by the adjustment of the frequency or phase.

BACKGROUND OF THE INVENTION

Changing the frequency or phase of the switching clock driving the pulse width modulator (PWM) in a class-D amplifier is known to produce artifacts at the output, which manifest as audible clicks. These clicks are known as pop-noise, which are an increasingly important parameter for audio amplifiers.

There are several reasons that the frequency or phase of the class-D switching clock might be changed. These include the use of frequency hopping to avoid the amplifier output switching frequency or a harmonic being on a tuned AM frequency; spread spectrum modulation in which the PWM switching clock frequency is modulated with a slowly varying signal to broaden the switching spectrum and so reduce the spectral density of electromagnetic interference (EMI); synchronisation of several Class-D amplifier integrated circuits in a system so that they all operate in phase; and changing between AD modulation (in which the half-bridges of the output channel are switched out of phase with each other) and BD modulation (in which the half-bridges are switched in phase).

To measure the pop-noise produced by a Class-D audio amplifier, the differential output voltage of the audio amplifier is first converted into a single-ended voltage. This single-ended voltage is fed through a 20 kHz low-pass filter and an ITU-R 2 k filter. Finally, the pop-noise is measured as the peak output voltage of the ITU-R 2 k filter. Around 5 years ago 10 mV pop-noise would have been considered perfectly acceptable; today 3 mV pop-noise is demanded; and it is expected that in the future lower values will be demanded.

SUMMARY OF THE INVENTION

According to the invention, there is provided an apparatus and a method as defined in the independent claims.

According to a first aspect of the invention, there is provided a method of adjusting the frequency or phase of operation of a Class-D amplifier, the method comprising making a series of step changes in the frequency or phase to adjust the frequency or phase from a start value to a desired end value, each step change in frequency or phase causing a corresponding disturbance of an output of the Class-D amplifier to produce a series of disturbances, each of which varies from an initial magnitude with a first peak in a first sense and then a second peak in an opposite second sense, wherein the time between the step changes is selected so that the second peak of each disturbance other than a final disturbance in the series overlaps the first peak of an immediately succeeding disturbance.

Each of the disturbances is one of the above-mentioned artifacts that produces pop-noise. Each has a positive peak and a negative peak. Instead of making a frequency change in one large step, the invention works by timing the step changes to align the positive peak of one disturbance with the negative peak of an adjacent disturbance in the series. In this way, the positive and negative peaks of all but the first and last disturbances in the series cancel so that the audible effects of the frequency change are much reduced.

It is not necessary for there to be exact alignment. Thus, although the time between the step changes could be selected so that the second peak of each disturbance other than a final disturbance in the series is exactly coincident with the first peak of an immediately succeeding disturbance, it is only necessary to there to be substantial coincidence.

The audibility of a disturbance to a signal depends on many things. A repetitive signal (e.g. caused by a series of small step changes in frequency or phase) within the audio-frequency band (20 Hz-20 kHz) results in a tone, a short disturbance having energy content within the audio-frequency band results in a pop. The results of the pop perceived by a listener also depends on the height the shape and the distance between two disturbances. A tone is generally much more annoying than a pop.

The invention effectively causes the audible results of a change in frequency or phase of a Class-D amplifier to manifest as two small pops rather than a tone. Pops are very acceptable to listeners when their peak voltage at the output of an ITU-2 k filter is in the range of around 7 mV to 20 mV.

A perceived audible disturbance is not necessarily equal to the electrical disturbance that causes it because only the energy within the audio-frequency band is audible. The perceived audible disturbance associated with an electrical signal is modeled by passing the electrical signal through an ITU-2 k filter. Thus, the electrical disturbance generated by a change in frequency or phase does not have to be canceled perfectly, but the output from an ITU-2 k filter should be canceled if there are to be no audible results. The profile of this filter rolls of fairly rapidly at relatively low frequencies, and these relatively low frequencies should preferably be canceled. Typically, it is desirable that everything under 4 kHz should be canceled, which can be achieved by causing the second peak of each disturbance other than a final disturbance in the series to be coincident within about 0.25 ms with the first peak of an immediately succeeding disturbance. The second peak of each disturbance other than a final disturbance in the series would then be considered to be substantially coincident with the first peak of an immediately succeeding disturbance.

Thus, the time between the step changes is preferably selected so that the second peak of each disturbance other than a final disturbance in the series is substantially coincident with the first peak of an immediately succeeding disturbance.

Typically, the time between the step changes is selected to equal half the duration of each disturbance. This time is selected so that the step changes occur at the points where the disturbances are crossing through the initial magnitude. This ensures good alignment between the first and second peaks of adjacent disturbances, although some variation for example due to component tolerances is acceptable without causing serious degradation.

For one range of applications, in particular for audio amplification, the time between step changes is in a range 5 μs to 200 μs, more preferably 10 μs to 100 μs and more preferably 30 μs to 80 μs. These values are found to provide the desired cancellation of pulses for typical PMW clock frequencies used in audio amplifiers. The corresponding PWM clock frequency is for example in the range 250 kHz to 550 kHz.

In one embodiment according to the first aspect of the invention, there is a method of adjusting the frequency of operation of a Class-D amplifier, wherein each step change in frequency is equal to the reciprocal of the period of a predefined even number of cycles of a clock arranged to drive a pulse width modulator forming part of the Class-D amplifier.

An even number of cycles is used because if an odd number were used considerably higher pop-noise (about 5 times higher) would result.

The predefined number of cycles is preferably two. Whilst two cycles represents the practical minimum, and hence the optimum, number of cycles to use, acceptable results can be achieved with higher even numbers of cycles especially where the period of the cycles is small. Nevertheless, there is a linear relationship between the size of the step change in frequency and the pop-noise generated. Since there is no cancellation of the first peak of the first disturbance in a series and the second peak of the final disturbance in a series, the results are more audible (and hence less acceptable) with a higher frequency step change, which is therefore more disturbing.

This embodiment exploits the fact that the magnitude of the pop-noise depends on the size of the step change in frequency. By keeping these to the lowest possible value the magnitude of the pop-noise is minimised.

In another aspect of the invention, there is provide a Class-D amplifier comprising a controller adapted to adjust the frequency or phase of operation of a pulse width modulator in the Class-D amplifier using a method according to the first aspect of the invention.

According to another aspect of the invention, there is provided a Class-D amplifier comprising:
  a pulse width modulator;
  an amplifier output stage driven by the pulse width modulator; and
  a controller for controlling the pulse width modulator to alter the period and/or timing of the pulse width modulation to provide frequency or phase adjustment of the Class-D amplifier output,
  wherein the controller is adapted to alter the period and/or timing of the pulse width modulation in discrete steps thereby providing a series of disturbances in the output of the Class-D amplifier, each of which varies from an initial magnitude with a first peak in a first sense and then a second peak in an opposite second sense, wherein the time between the step changes is selected so that the second peak of each disturbance other than a final disturbance in the series overlaps the first peak of an immediately succeeding disturbance.

BRIEF DESCRIPTION OF THE DRAWINGS

Examples of the invention will now be described in detail with reference to the accompanying drawings, in which.

DETAILED DESCRIPTION OF THE EMBODIMENTS

The invention exploits two principles. The first principle is based on causing an overlap between the disturbances caused at the output of a Class-D amplifier when the frequency or phase is changed in steps. This causes at least partial cancellation between positive and negative peaks of adjacent disturbances in a succession of disturbances caused by a plurality of step changes in frequency or phase, which together add up to make a required change in frequency or phase from a starting value to an end value. Ideally, the overlap is precisely timed so that there is perfect cancellation between the positive and negative peaks.

The second principle is that the size of the disturbance caused by a change in frequency or phase is proportional to the magnitude of the change in frequency or phase. Thus, the invention seeks to minimise the size of the change in frequency or phase to small steps, for example a single clock pulse, between a starting value and a required end value.

Figure 1:
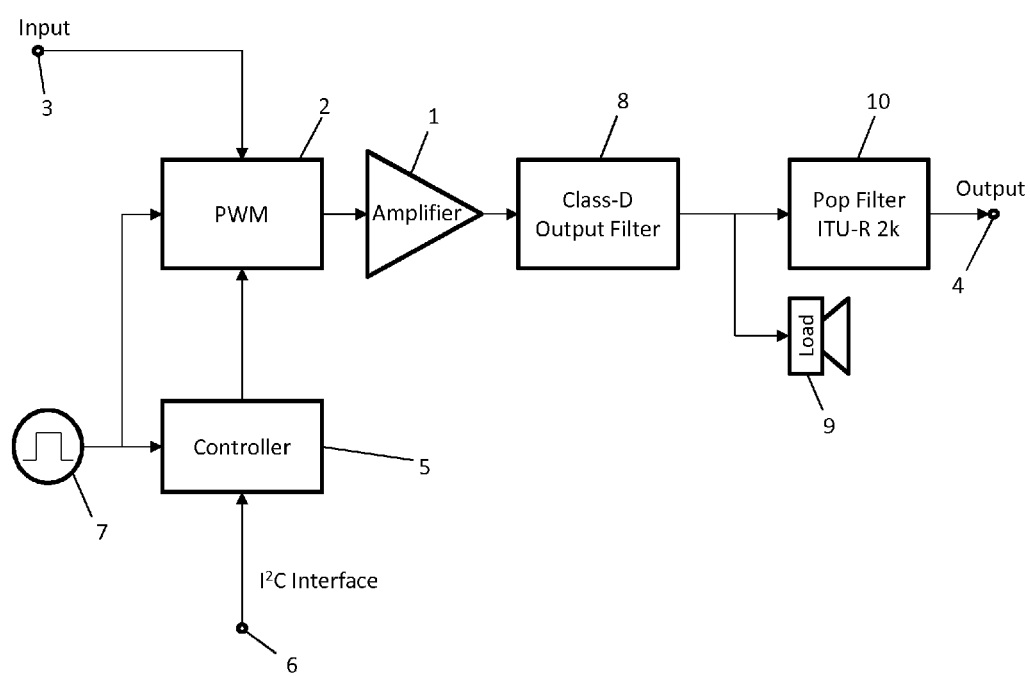
FIG. 1 shows a Class-D amplifier with a PWM with a controller adapted to change the PWM frequency and/or phase with a method according to the invention.

FIG. 1 shows a Class-D amplifier comprising a conventional Class-D output stage 1 driven by a pulse width modulator (PWM) 2. The PWM 2 receives an input signal from input terminal 3 and modulates it to produce a pulse width modulated signal for driving the output stage 1. The PWM typically comprises a triangular waveform generator and a comparator. The switches in the output stage 1 are switched in accordance with the pulse width modulated signal in the usual way to generate an output signal, which is filtered by a Class-D output filter 8. The filtered output signal from output filter 8 is used to drive a loudspeaker 9. The period of the pulse width modulation is controlled by a controller 5, which receives commands over an I$^2$C interface 6 (or any other type of suitable interface). The pulse width modulation timing is derived from a high frequency master clock 7 coupled to the controller 5 and PWM 2. The audible effects of pop-noise can be measured at an output terminal 4 by filtering the output from Class-D output filter 8 with an ITU-R 2 k filter 10.

Figure 2:
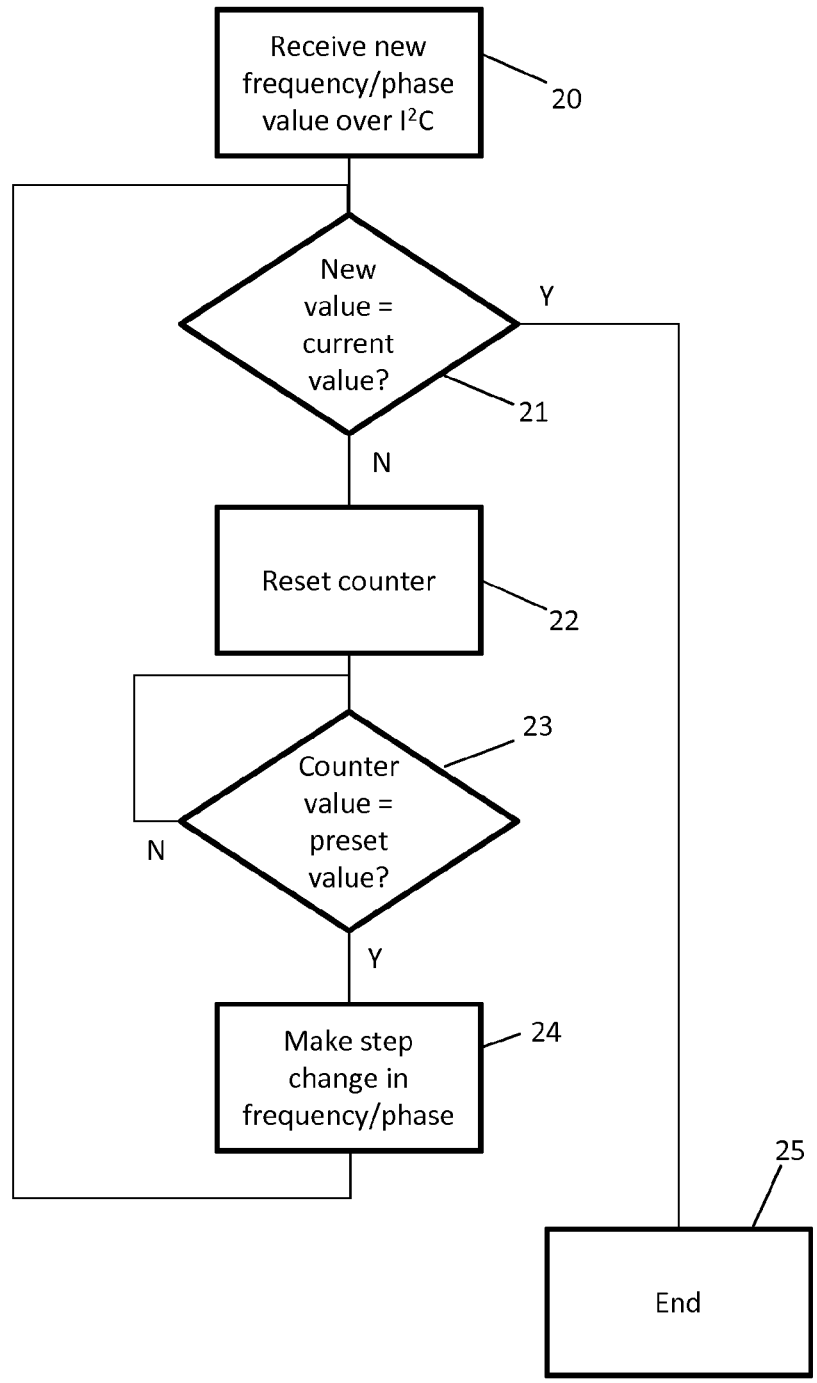
FIG. 2 shows a flowchart of a first method according to the invention.

FIG. 2 shows a flowchart illustrating a first method for adjusting the frequency or phase of operation of the Class-D amplifier shown in FIG. 1. The method is performed by the controller 5 adjusting the period and/or timing of the pulse width modulation to perform the frequency or phase adjustment. In step 20, a new PWM frequency or phase is programmed into the controller via the I$^2$C interface 6. In step 21, the new value received in step 20 is compared with the current value of frequency or phase. If they differ, then a timing counter is reset in step 22 and then allowed to count pulses of the master clock 7. In step 23, the value in the counter is compared with a preset value. When the counter reaches the preset value, a step change is made to the frequency or phase and processing reverts to step 21. The loop of steps 21, 22, 23 and 24 just described is repeated until the current value of the frequency or phase is determined to equal the newly-programmed value in step 21 at which point the method ends in step 25. Although the process has been described with reference to a flowchart showing a sequence of events, it should be appreciated that in a practical implementation the comparison of the new value with the current value of frequency or phase will happen continuously and not just after a new value has been received over the I$^2$C interface 6. This enables the current value to be updated constantly by hardware, which may be required to implement spread spectrum modulation.

The magnitude of each step change in frequency or phase made in step 24 may be programmed via the I$^2$C interface 6. Similarly, the preset value with which the counter value is compared in step 23 may be programmed via the I$^2$C interface 6. A typical value for this is 6000 when the master clock is running at 100 MHz. Thus, the time between step changes in frequency or phase is 6000 clock periods or 60 μs.

Simulation has shown that a typical period for the disturbances caused by changing frequency or phase is approximately 120 μs. Therefore, for perfect cancellation the delay between step changes in frequency or phase should be half this amount, i.e. 60 μs as above. Simulation has also shown that up to 10% deviation still results in nearly perfect cancellation.

This simulation is based on an audio amplifier, with a PWM clock frequency in the range 250 kHz to 550 kHz. This is in the AM audio band, and for this reason frequency hopping is often used to prevent disturbances in the audio band. The adjustment to the PWM clock frequency typically takes place in a background scan on the AM band.

Each frequency hop for example can be of the order of 100 kHz (typically somewhere in the range 50 kHz to 200 kHz).

The invention can be applied to Class D amplifiers with other PWM frequencies, for example designs are known with a 1500 kHz PWM frequency.

Figure 3:
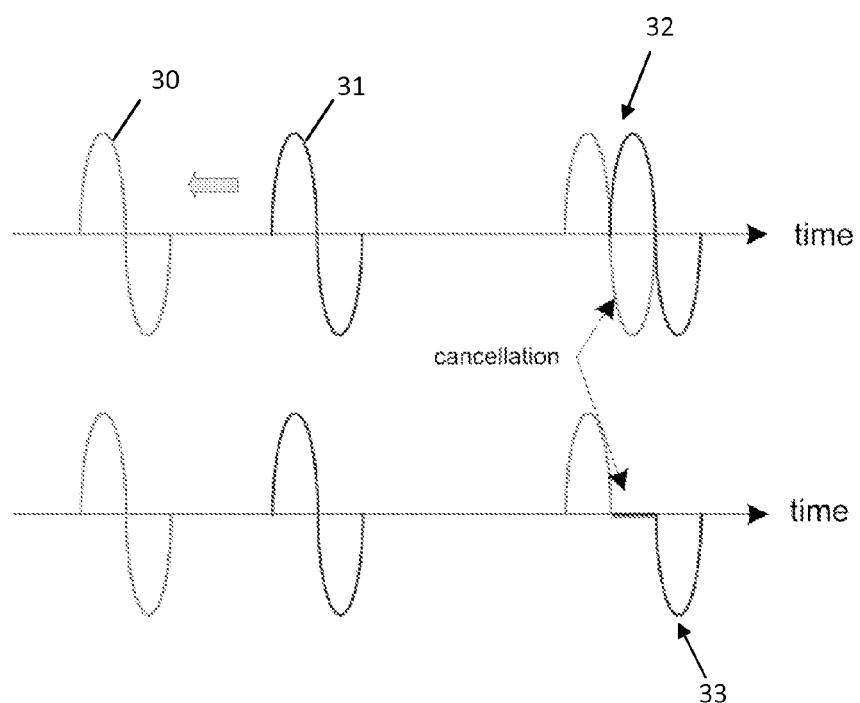
FIG. 3 provides an illustration of the resultant output from the amplifier of FIG. 1 when the frequency is adjusted using the method shown in FIG. 2.

Each step change in frequency or phase causes a corresponding disturbance on the output of Class-D amplifier output stage 1. Each disturbance is identical provided that the magnitude of the step change in frequency or phase remains the same. Two of these disturbances 30, 31 are shown in FIG. 3. Each disturbance 30, 31 comprises a positive peak followed by a negative peak and is symmetrical (i.e. the positive and negative peaks have the same shape). The period of the disturbances 30, 31 depends on the component values of filter 10. Since these values are standardised they are tightly controlled, typically within a 1% tolerance. Thus, the period of the disturbances due to frequency and phase changes are predictable and constant within a tight tolerance margin.

By causing the positive and negative peaks of adjacent disturbances to overlap, at least partial cancellation between them is possible. This overlap is caused to occur by selecting the preset value used in step 23 so that the step changes in frequency or phase occur within a window between half and the whole period of the disturbances. Ideally, the step changes are spaced apart by half the period of the disturbances to cause a perfect overlap between positive and negative peaks of adjacent disturbances. The counter value of 6000 referred to above is selected to provide this perfect overlap (although a small variation may occur in practice due to component tolerances in the output filter). The two disturbances spaced apart by a half period are shown at 32 in FIG. 3 and the resultant output is shown at 33. Thus, for any number of disturbances (i.e. step changes in frequency or phase) in series that are spaced apart by a half period, the resultant disturbance (i.e. pop-noise) is only the first peak and the final peak. The magnitude of these may be minimised by reducing the size of the step changes in frequency or phase. Step changes in frequency may be equal to the reciprocal of the period of any number of cycles of the master clock 7. Typically, a value of two cycles is chosen to minimise the frequency step and hence the pop-noise.

The invention is not limited to frequency hopping for preventing disturbance in the output; the invention can for example be used to implement spread spectrum modulation or to smooth AD to BD mode switching.

The invention has been described above in connection with the driving of a loudspeaker, but there are of course other applications of Class D amplifiers, and the invention is not limited to any particular use of the amplifier.

The timing control described above is based on the counting of master clock cycles. However, any suitable mechanism for deriving a fixed time delay can be employed.

As mentioned above, there is significant tolerance in the precise time delay between the frequency/phase adjustments, and this means a single fixed time delay can be determined for a particular amplifier specification. However, the invention does not exclude that the time delay is variable based on some form of feedback control to maintain optimal pop noise reduction.

Other variations to the disclosed embodiments can be understood and effected by those skilled in the art in practising the claimed invention, from a study of the drawings, the disclosure, and the appended claims. In the claims, the word "comprising" does not exclude other elements or steps, and the indefinite article "a" or "an" does not exclude a plurality. Any reference signs in the claims should not be construed as limiting the scope.

The invention claimed is:

1. A method of adjusting the frequency or phase of operation of a Class-D amplifier, the method comprising:
    making a series of step changes in one of the frequency and the phase to adjust the frequency or phase from a start value to a desired end value, each step change in frequency or phase causing a corresponding disturbance of an output of the Class-D amplifier to produce a series of disturbances, each of which varies from an initial magnitude with a first peak in a first sense and then a second peak in an opposite second sense,
    wherein a time between the step changes is selected so that the second peak of each disturbance other than a final disturbance in the series overlaps the first peak of an immediately succeeding disturbance.

2. A method according to claim 1, wherein the time between the step changes is selected so that the second peak of each disturbance other than a final disturbance in the series is substantially coincident with the first peak of an immediately succeeding disturbance.

3. A method according to claim 1, wherein the time between the step changes is selected to equal half the duration of each disturbance.

4. A method of adjusting the frequency of operation of a Class-D amplifier according to claim 1, wherein each step change in frequency is equal to the reciprocal of the period of a predefined even number of cycles of a clock arranged to drive a pulse width modulator forming part of the Class-D amplifier.

5. A method according to claim 4, wherein the predefined number of cycles is two.

6. A method according to claim 1, wherein the time between step changes is in a range 5 μs is to 200 μs.

7. A method according to claim 6, wherein the time between step changes is in a range 10 μs is to 100 μs is.

8. A method according to claim 6, wherein the time between step changes is in a range 30 μs is to 80 μs.

9. A method according to claim 1, wherein the series of step changes in the frequency or phase are obtained by controlling a pulse width modulator which drives an amplifier output stage of the class D amplifier, thereby to alter at least one of the period and timing of the pulse width modulation to provide the desired frequency or phase adjustment of the amplifier output, wherein the clock frequency of the pulse width modulator is in a range of 250 kHz to 550 kHz.

10. A Class-D amplifier comprising a controller adapted to adjust one of the frequency and the phase of operation of a pulse width modulator which drives an amplifier output stage of the Class-D amplifier using a method according to claim 1.

11. A Class-D amplifier comprising:
    a pulse width modulator;
    an amplifier output stage driven by the pulse width modulator; and
    a controller for controlling the pulse width modulator to alter the at least one of a period and a timing of the pulse width modulation to provide frequency or phase adjustment of the Class-D amplifier output,
wherein the controller is adapted to alter the at least one of the period and the timing of the pulse width modulation in discrete steps thereby providing a series of disturbances in the output of the Class-D amplifier, each of which varies from an initial magnitude with a first peak in a first sense and then a second peak in an opposite second sense, wherein the time between the step changes is selected so that the second peak of each disturbance other than a final disturbance in the series overlaps the first peak of an immediately succeeding disturbance.

12. An amplifier according to claim 11, wherein the time between step changes is in a range 5 μs to 200 μs.

13. An amplifier according to claim 11, wherein the time between step changes is in a range 10 μs to 100 μs.

14. An amplifier according to claim 11, wherein the time between step changes is in a range 30 μs to 80 μs.

15. An amplifier according to any claim 11, wherein the clock frequency of the pulse width modulator is in a range of 250 kHz to 550 kHz.

\* \* \* \* \*